(12) United States Patent  (10) Patent No.: US 9,281,421 B2
Yamasaki et al.  (45) Date of Patent: Mar. 8, 2016

(54) CONDUCTIVE REFLECTIVE FILM AND METHOD OF MANUFACTURING THE SAME

(71) Applicant: Mitsubishi Materials Corporation, Tokyo (JP)

(72) Inventors: Kazuhiko Yamasaki, Naka (JP); Fuyumi Mawatari, Naka (JP); Satoko Higano, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 236 days.

(21) Appl. No.: 13/768,056

(22) Filed: Feb. 15, 2013

(65) Prior Publication Data

US 2013/0214216 A1    Aug. 22, 2013

(30) Foreign Application Priority Data

Feb. 20, 2012   (JP) ................................ 2012-033576

(51) Int. Cl.
| | |
|---|---|
| H01B 1/02 | (2006.01) |
| H01L 31/0224 | (2006.01) |
| H01B 1/22 | (2006.01) |
| C23C 18/04 | (2006.01) |
| C23C 18/12 | (2006.01) |
| H01L 31/046 | (2014.01) |
| H01L 31/056 | (2014.01) |

(52) U.S. Cl.
CPC ........ *H01L 31/022425* (2013.01); *C23C 18/04* (2013.01); *C23C 18/1212* (2013.01); *H01B 1/22* (2013.01); *H01L 31/046* (2014.12); *H01L 31/056* (2014.12); *H01B 1/02* (2013.01); *Y02E 10/52* (2013.01)

(58) Field of Classification Search
CPC ......................................................... H01B 1/02
USPC ......................................................... 252/514
See application file for complete search history.

(56) References Cited

U.S. PATENT DOCUMENTS

| | | | |
|---|---|---|---|
| 8,921,688 B2* | 12/2014 | Yamasaki et al. ............. | 136/256 |
| 2001/0008458 A1* | 7/2001 | Asano et al. ................. | 359/267 |
| 2010/0126582 A1 | 5/2010 | Yamasaki et al. | |
| 2012/0015472 A1 | 1/2012 | Hayashi et al. | |
| 2012/0308720 A1 | 12/2012 | Yamasaki et al. | |

FOREIGN PATENT DOCUMENTS

| | | |
|---|---|---|
| JP | 05-095157 A | 4/1993 |
| JP | 09-246577 A | 9/1997 |

(Continued)

OTHER PUBLICATIONS

Office Action mailed Jun. 9, 2015 for the corresponding Japanese Application No. 2012-033576.

*Primary Examiner* — Harold Pyon
*Assistant Examiner* — William Young
(74) *Attorney, Agent, or Firm* — Leason Ellis LLP.

(57) ABSTRACT

A conductive reflective film has a silver nanoparticle-sintered film with a surface coating composition containing a hydrolysate of a metal alkoxide wet-coated thereto. The coated film is then fired. Also provided is a method of manufacturing the conductive reflective film comprising the steps of coating a surface coating composition containing a hydrolysate of a metal alkoxide on a silver nanoparticle-sintered film using a wet coating method, and firing the silver nanoparticle-sintered film having the coated film. The conductive reflective film provides improved adhesion properties with respect to a base material while maintaining a high reflectivity and a high conductivity of a silver nanoparticle-sintered film.

8 Claims, 1 Drawing Sheet

(56) References Cited

FOREIGN PATENT DOCUMENTS

| JP | 2008-288568 A | 11/2008 |
| JP | 2010-087479 A | 4/2010 |
| JP | 2011-066403 A | 3/2011 |
| JP | 2011-192804 A | 9/2011 |
| WO | WO-2010/113708 A | 7/2010 |

\* cited by examiner

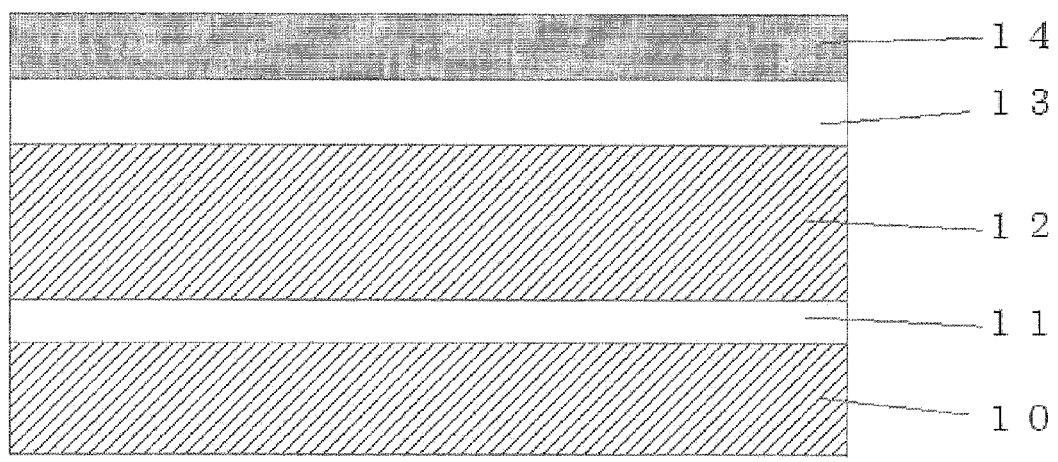

CONDUCTIVE REFLECTIVE FILM AND METHOD OF MANUFACTURING THE SAME

CROSS-REFERENCE TO RELATED PATENT APPLICATION(S)

This application claims the benefit of Japanese Patent Application No. 2012-033576, filed Feb. 20, 2012, which is incorporated by reference herein.

FIELD OF THE INVENTION

The present invention relates to a conductive reflective film and a method of manufacturing the same. More specifically, the invention particularly relates to a conductive reflective film suitable for a thin film solar cell rear surface electrode and a method of manufacturing the same.

BACKGROUND OF THE INVENTION

Currently, attempts are being made to promote the research and development and practical application of clean energy from the standpoint of protecting the environment, and solar cells have attracted attention since solar light, which is an energy source, is inexhaustible, pollution free, and more. In the past, bulk solar cells of single crystal silicon or polycrystalline silicon have been used as solar cells; however, bulk solar cells need a large amount of energy and time for the growth of crystals, and complicated processes are required in the subsequent manufacturing processes such that the manufacturing costs increase and the productivity is low, and therefore there is an urgent demand for the development of solar cells which use as little silicon as possible.

Hence, active efforts are being made to develop a thin film solar cell for which a semiconductor of amorphous silicon or the like having a thickness of, for example, 0.3 µm to 2 µm is used. Since a thin film solar cell has a structure in which a necessary amount of a semiconductor layer for photoelectric conversion is formed on a glass substrate or a heat-resistant plastic substrate, the thin film solar cell is advantageous in terms of being thin, lightweight, and low cost, having an area which is easily increased, and the like.

For the thin film solar cell, there are a super-straight structure and a sub-straight structure, and the super-straight structure generally employs a multilayer structure, in which a substrate, a transparent electrode, a photoelectric conversion layer, and a rear surface electrode are sequentially formed, since solar light is made to be incident from the translucent substrate side. Here, in a case in which the photoelectric conversion layer is constituted by an Si-based material such as an amorphous Si film or a thin film polycrystalline Si film, since the extinction coefficient of the photoelectric conversion layer is relatively small, in a commonly used film thickness of several micrometers, some of the incident light permeates the photoelectric conversion layer, and does not contribute to power generation. Therefore, in general, a conductive reflective film is used for the rear surface electrode so as to reflect light which is not absorbed and return the light to the photoelectric conversion layer, thereby improving the power generation efficiency.

For the thin film solar cell, in the past, the transparent electrode and/or the conductive reflective film have been formed using a vacuum film forming method such as sputtering; however, in general, huge costs are incurred in the introduction, maintenance, and operation of a large-scale vacuum film forming apparatus. In order to solve the above problem, there is a technique in which non-electrolytic plating is carried out to produce a conductive reflective film which is formed using a wet film forming method for use in solar cells (Japanese Patent Application Laid-Open (kokai) No. H05-95127).

However, the non-electrolytic plating method employs processes, in which a plate protection film is formed on the surface side, a pretreatment is carried out using an HF solution on a side on which a plating treatment is to be carried out, the subject is immersed in a non-electrolytic plating fluid, and the like, the processes of the method are problematic, and it becomes necessary to treat the liquid waste.

Next, as a method that is more convenient than the non-electrolytic plating method, research is being carried out into a method in which a metal having high reflectivity such as silver is made into nanoparticles, and the particles are coated onto the surface (Japanese Patent Application Laid-Open (kokai) No. H09-246577); however, generally, there is a tendency for the reflectivity from the rear surface side to decrease compared to the reflectivity from the front side.

Research is also being carried out into a conductive reflective film which overcomes the above disadvantages, and is formed on a base material by firing metal nanoparticles, in which the average diameter of pores appearing in the contact surface of the film on the base material side is 100 nm or less, the average depth at which the pores are located is 100 nm or less, and the number density of the pores is 30 particles/$\mu m^2$ or less (Japanese Patent Application Laid-Open (kokai) No. 2008-288568).

However, it has been found that a conductive reflective film in which the average diameter and the like of the pores appearing in the contact surface on the base material side are controlled has high reflectivity from the rear surface side, but film stress is caused during the firing of the nanoparticles, and therefore there is little possibility to improve the adhesion properties of a stand-alone metal nanoparticle-sintered film with respect to the base material.

SUMMARY OF THE INVENTION

Problem that the Invention is to Solve

The invention solves the above disadvantages of the related art and achieves the above-mentioned improvement, and an object of the invention is to provide a conductive reflective film with improved adhesion properties with respect to a base material using a wet coating method while maintaining the high reflectivity and high conductivity of a silver nanoparticle-sintered film without requiring a vacuum film forming method, and a method of manufacturing the same.

Means for Solving the Problems

As a result of a thorough investigation regarding a conductive reflective film mainly used for thin film solar cells, the present inventors found that a conductive reflective film with improved adhesion properties which maintains the high reflectivity and high conductivity of a silver nanoparticle-sintered film can be obtained by carrying out a specific surface coating on a silver nanoparticle-sintered film having a porous structure.

The invention relates to a conductive reflective film and a method of manufacturing the same which solve the above problems using the configuration described below.

(1) A conductive reflective film formed by coating a surface coating composition containing a hydrolysate of a metal alkoxide on a silver nanoparticle-sintered film using a wet coating method, and then firing the silver nanoparticle-sintered film having a coated film.

(2) A method of manufacturing a conductive reflective film in which a surface coating composition containing a hydrolysate of a metal alkoxide is coated on a silver nanoparticle-sintered film using a wet coating method, and then the silver nanoparticle-sintered film having a coated film is fired.

(3) A thin film solar cell rear surface electrode including the conductive reflective film according to the above (1).

(4) A thin film solar cell including the thin film solar cell rear surface electrode according to the above (3).

Advantage of the Invention

According to the invention (1), since the silver nanoparticle-sintered film is coated with the surface coating composition, is fired so that the surface coating composition permeates the pores in the silver nanoparticle-sintered film and/or the interface between the conductive reflective film and the base material on which the conductive reflective film is formed, and is then cured, it is possible to provide a conductive reflective film with improved adhesion properties with respect to the base material which maintains the high reflectivity and high conductivity of the silver nanoparticle-sintered film. According to the invention (2), it is possible to manufacture a conductive reflective film having high reflectivity, high conductivity, and favorable adhesion properties using a convenient and low-cost wet coating method. In addition, according to the invention (3), it is possible to provide a thin film solar cell having favorable photoelectric conversion efficiency and high reliability.

BRIEF DESCRIPTION OF THE DRAWINGS

These and other features and advantages of the present invention will become more readily appreciated when considered in connection with the following detailed description and appended drawing(s), wherein like designations denote like elements in the various views, and wherein:

FIG. 1 is a schematic view of the cross-sectional surface of a thin film solar cell in which the conductive reflective film of the invention is used.

DETAILED DESCRIPTION OF THE INVENTION

Best Mode for Carrying Out the Invention

Hereinafter, the invention will be described specifically based on embodiments. Meanwhile, % refers to mass % unless otherwise described except in the case of intrinsic numeric values.

[Surface Coating Composition]

Since the surface coating composition permeates pores in the silver nanoparticle-sintered film and/or the interface between the conductive reflective film and the base material on which the conductive reflective film is formed, and is then cured, the adhesion properties between the conductive reflective film and the base material are improved. The surface coating composition contains a hydrolysate of a metal alkoxide, and examples of a metal in the metal alkoxide include silicon, titanium, aluminum, chromium, manganese, iron, cobalt, nickel, silver, copper, zinc, molybdenum, tin, indium, antimony, and the like, and silicon or titanium is preferable. In addition, examples of an alkoxide in the metal alkoxide include methoxide, ethoxide, propoxide, butoxide, and the like, and methoxide, ethoxide, and propoxide are preferable from the viewpoint of viscosity and the rate of hydrolysis.

Examples of the metal alkoxide include tetramethoxysilane, tetraethoxysilane, tetraisopropoxy titanium, and the like, and tetraethoxysilane is preferable. Here, regarding the hydrolysate of the metal alkoxide, a case in which the metal alkoxide is tetraethoxysilane will be described. The hydrolysate of tetraethoxysilane is, for example, $Si(OH)_4$ generated according to a reaction formula (1):

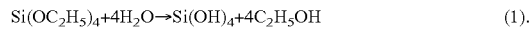

$$Si(OC_2H_5)_4 + 4H_2O \rightarrow Si(OH)_4 + 4C_2H_5OH \qquad (1).$$

Meanwhile, after firing, the hydrolysate becomes $SiO_2$ due to a reaction such as, for example, a reaction formula (2):

$$Si(OH)_4 \rightarrow SiO_2 + 2H_2O \qquad (2).$$

In addition, the surface coating composition includes a dispersion medium, and the dispersion medium preferably contains 1 mass % or more of water and 2 mass % or more of a solvent that is compatible with water, for example, an alcohol, with respect to 100 mass % of the entire dispersion medium. For example, in a case in which the dispersion medium consists only of water and an alcohol only, when water is included as 2 mass %, the alcohol is included as 98 mass5, and when alcohol is included as 2 mass %, water is included as 98 mass %. This is because, when the content of water is less than 1 mass % or the content of the alcohol is less than 2 mass %, it becomes difficult to sinter a film obtained by coating the surface coating composition using the wet coating method at a low temperature, and the conductivity and reflectivity of the fired conductive reflective film are degraded. Examples of the alcohol include methanol, ethanol, propanol, butanol, ethylene glycol, propylene glycol, diethylene glycol, glycerol, erythritol, and the like, and the above may be used as a mixture.

The surface coating composition can be mixed with a coupling agent, an antioxidant, a leveling agent, an anti-sagging agent, a filler, a stress reliever, and other additives according to necessity within a scope in which the object of the invention is not impaired.

[Conductive Reflective Film]

The conductive reflective film of the invention is formed by coating a surface coating composition containing a hydrolysate of a metal alkoxide on a silver nanoparticle-sintered film using a wet coating method, and then firing the silver nanoparticle-sintered film having a coated film. Here, the silver nanoparticle-sintered film is formed on a base material. The base material is not particularly limited, and examples thereof include a glass substrate, a transparent conductive film of a solar cell, and the like.

The conductive reflective film is particularly preferably formed on a transparent conductive film of a solar cell. FIG. 1 shows a schematic view of the cross-sectional surface of a thin film solar cell in which the conductive reflective film of the invention is used. FIG. 1 is an example of a super straight-type thin film solar cell. The thin film solar cell 1 sequentially includes a substrate 10, a transparent electrode layer 11, a photoelectric conversion layer 12, a transparent conductive film 13, and a conductive reflective film 14, and solar light is incident from the substrate 10 side. The majority of incident solar light is reflected at the conductive reflective film 14, and returned to the photoelectric conversion layer 12, thereby improving the conversion efficiency. As such, when the conductive reflective film 14 is formed on the transparent conductive film 13 of the thin film solar cell as the base material, it is possible to improve the conversion efficiency of the thin film solar cell, which is preferable. Meanwhile, it is also possible to form the conductive reflective film onto the photoelectric conversion layer.

[Silver Nanoparticle-Sintered Film]

The silver nanoparticle-sintered film provides reflective properties and conductive properties to the conductive reflective film. The silver nanoparticle-sintered film preferably further includes magnesium and tin in addition to silver from the viewpoint of the durability and work function of the conductive reflective film. The silver nanoparticle-sintered film preferably contains 75 parts by mass or more of silver with respect to 100 parts by mass of the silver nanoparticle-sintered film from the viewpoint of the reflective properties and conductive properties of the conductive reflective film. In addition, the average particle diameter of silver nanoparticles is preferably 10 nm to 50 nm, and the silver nanoparticles more preferably contain 700 or more of silver nanoparticles having a particle diameter in a range of from 10 nm to 50 nm in terms of number average. Here, the average particle diameter and the number average content of the metal nanoparticles having a particle diameter in a range of from 10 nm to 50 nm are measured through the dynamic light scattering method using an LB-550 manufactured by Horiba Ltd. The shape of the silver nanoparticles is preferably spherical or plate-like from the viewpoint of dispersive properties and reflective properties.

The silver nanoparticle-sintered film preferably includes added substances. The added substances are present in the conductive reflective film even after sintering, and, when the added substances are present between silver nanoparticles, it is possible to suppress the grain growth of the silver nanoparticles during sintering, and, when the added substances are present in pores in the silver nanoparticle film, the reflective characteristics of the conductive reflective film improve, the photoelectric conversion efficiency of the thin film solar cell increases, and the heat resistance, light resistance, or corrosion resistance of the conductive reflective film is also improved. Furthermore, the added substances improve the adhesion properties of the conductive reflective film. Therefore, the durability of the thin film solar cell increases.

Examples of the added substances include organic polymers, metal oxides, metal hydroxides, organic metal compounds, and silicone oil, organic polymers are preferable, and the combined use of organic polymers and metal hydroxides or organic metal compounds is more preferable.

The organic polymer used as the added substance is preferably at least one selected from a group consisting of polyvinylpyrrolidone (PVP), copolymers of polyvinylpyrrolidone, and water-soluble cellulose from the viewpoint of the reflective characteristics and conductive properties of the conductive reflective film. Examples of the copolymers of polyvinylpyrrolidone include PVP-methacrylate copolymers, PVP-styrene copolymers, PVP-vinyl acetate copolymers, and the like. In addition, examples of the water-soluble cellulose include cellulose ethers of hydroxypropyl methylcellulose, methylcellulose, hydroxyethyl methylcellulose, and the like. PVP is more preferable in terms of the reflective characteristics, conductive properties, and adhesion properties of the conductive reflective film.

Examples of the metal oxide used as the added substance include oxides or complex oxides including at least one oxide selected from a group consisting of tin, indium, zinc, and antimony, and tin-doped indium oxide and/or zinc oxide are preferable.

Examples of the metal hydroxide used as the added substance include hydroxides of magnesium, lithium, aluminum, iron, cobalt, nickel, and the like, and magnesium hydroxide and lithium hydroxide are preferable.

Examples of the organic metal compound used as the added substance include metal soaps and metal complexes of silicon, titanium, zirconium, zinc, tin, and the like. Examples of the metal soap include zinc acetate, zinc oxalate, tin acetate, and the like, and examples of the metal complex include zinc acetylacetone complexes and the like. Zinc acetate is preferable from the viewpoint of the adhesion properties to the conductive reflective film.

Examples of the silicone oil used as the added substance include straight silicone oil or modified silicone oil, and modified silicone oil is preferable.

The fraction of the added substances is preferably 0.1 parts by mass to 25 parts by mass with respect to 100 parts by mass of the silver nanoparticle-sintered film. When the fraction is 0.1 parts by mass or more, the adhesion force with the base material is favorable, and when the fraction is 25 parts by mass or less, film variation does not easily occur during film formation.

[Conductive Reflective Film]

The conductive reflective film is formed by coating the surface coating composition on the silver nanoparticle-sintered film using the wet coating method, and then firing the silver nanoparticle-sintered film having a coated film.

Firstly, the surface coating composition is coated on the silver nanoparticle-sintered film using the wet coating method. The coating is carried out so that the thickness of the fired surface coated layer preferably becomes 0.005 µm to 0.2 µm, and more preferably becomes 0.01 µm to 0.05 µm. When the thickness after firing is 0.005 µm or more, the adhesion properties of the conductive reflective film improve, and, when the thickness is 0.2 µm or less, it is easy to maintain the high reflectivity and high conductivity of the silver nanoparticle-sintered film.

There are various wet coating methods, namely, spray coating method, dispenser coating method, spin coating method, knife coating method, slit coating method, ink jet coating method, screen printing method, offset printing method, and die coating method. Preferably, one of the above methods is used. Yet, the method employed is not limited to the above, and any method can be used.

Next, the silver nanoparticle-sintered film having the coated film of the surface coating composition is held and fired at a temperature of preferably 130° C. to 350° C., and more preferably 150° C. to 200° C. for preferably 5 minutes to 60 minutes in the atmosphere or an atmosphere of an inert gas such as nitrogen or argon.

The reason why the preferable firing temperature of the silver nanoparticle-sintered film having the coated film is in a range of 130° C. to 350° C. is that there is a disadvantage in that insufficient curing occurs in the conductive reflective film at lower than 130° C., and the production benefits of a so-called low-temperature process cannot be utilized at higher than 350° C., that is, the manufacturing costs increase, and the productivity is degraded.

The reason why the preferable firing time of the silver nanoparticle-sintered film having the coated film is in a range of 5 minutes to 60 minutes is that, when the firing time is less than 5 minutes, there is a disadvantage in that insufficient curing is caused in the conductive reflective film, and, when the firing time exceeds 60 minutes, a disadvantage is caused in that the manufacturing costs increase more than necessary such that productivity is degraded.

The thickness of the conductive reflective film is preferably 0.005 µm to 0.2 µm from the viewpoint of reflective properties and conductive properties.

When pores present in the surface of the conductive reflective film on the light-emitting layer side have an average diameter of 100 nm or less, an average depth of 100 nm or less, and a number density of 30 particles/µm$^2$, a high diffusion reflectivity of 80% or more of the theoretical reflectivity can be achieved in a wavelength range of 380 nm to 780 nm, which is preferable.

The conductive reflective film obtained in the above manner has high reflectivity and high conductivity, and the adhesion properties with respect to the base material on which the conductive reflective film is formed are also favorable. In addition, in a case in which the base material is conductive, it is also possible to maintain an ohmic electrical bonding with the base material.

[Method of Forming the Silver Nanoparticle-Sintered Film]

For reference, the method of forming the silver nanoparticle-sintered film will be described below. The silver nanoparticle-sintered film can be formed by coating the silver nanoparticle-sintered film composition on the base material using the wet coating method, and then firing the base material having the coated film.

The silver nanoparticle-sintered film composition contains silver nanoparticles and a dispersion medium, and preferably contains the added substances. The silver nanoparticles and the added substances are as aforementioned.

The dispersion medium is also aforementioned; however, when the dispersion medium further includes a protective agent containing any one or both of a hydroxyl group (—OH) and a carbonyl group (—C=O) that chemically modify the surfaces of the metal nanoparticles, the dispersion stability of the silver nanoparticle-sintered film composition is excellent, and an effective action is generated for the low-temperature sintering of the coated film, which is preferable. Examples of the protective agent include sodium citrate, sodium malate, and the like.

Firstly, the silver nanoparticle-sintered film composition is coated on the base material using the wet coating method. The coating is carried out so that the thickness of the fired silver nanoparticle-sintered film preferably becomes 0.005 μm to 0.2 μm. The wet coating method is aforementioned.

Next, the base material having a coated film of the silver nanoparticle-sintered film composition is fired. The firing conditions are the same as the firing conditions of the silver nanoparticle-sintered film having the coated film of the surface coating composition. The silver nanoparticle-sintered film can be formed in the aforementioned manner.

EXAMPLES

Hereinafter, the invention will be described in detail using examples, but the invention is not limited thereto.

<<Manufacturing of the Silver Nanoparticle-Sintered Film Composition>>

An aqueous solution of a metal salt was prepared by dissolving silver nitrate in deionized water. In addition, an aqueous solution of sodium citrate having a concentration of 26 mass % was prepared by dissolving sodium citrate in deionized water. Granular ferrous sulfate was directly added to and dissolved in the aqueous solution of sodium citrate in a nitrogen gas stream held at 35° C. so as to prepare an aqueous solution of a reducing agent containing citric acid ions and ferrous ions at a molar ratio of 3:2.

Next, while the nitrogen gas stream was held at 35° C., a stirring bar of a magnetic stirrer was put into the aqueous solution of a reducing agent, and the aqueous solution of a metal salt was added dropwise to and mixed with the aqueous solution of a reducing agent while the aqueous solutions were stirred at a rotation rate of the stirring bar of 100 rpm. Here, the concentrations of the respective solutions were adjusted so that the amount of the aqueous solution of a metal salt added to the aqueous solution of a reducing agent became 1/10 or less of the amount of the aqueous solution of a reducing agent, thereby holding the reaction temperature at 40° C. even when the aqueous solution of a room temperature metal salt was added dropwise. In addition, the mixing ratio of the aqueous solution of a reducing agent and the aqueous solution of a metal salt was set so that the molar ratios of the citric acid ions and the ferrous ions in the aqueous solution of a reducing agent all became three times the total valence number of metal ions in the aqueous solution of a metal salt. After the aqueous solution of a metal salt was completely added dropwise to the aqueous solution of a reducing agent, the solution mixture was further stirred for 15 minutes so as to generate silver nanoparticles in the solution mixture, thereby obtaining a silver nanoparticle dispersion fluid in which silver nanoparticles were dispersed. The pH of the silver nanoparticle dispersion fluid was 5.5, and the stoichiometric amount of the silver nanoparticles generated in the dispersion fluid was 5 g/liter.

The obtained silver nanoparticle dispersion fluid was allowed to stand at room temperature so as to settle the silver nanoparticles in the dispersion fluid, and aggregates of the settled silver nanoparticles were separated through decantation. Deionized water was added to the separated silver nanoparticle aggregates so as to produce dispersion, a desalination treatment was carried out through ultrafiltration, and, furthermore, displacement washing was carried out using methanol, thereby adjusting the content of the metal (silver) to 50 mass %. After that, relatively large silver particles having a particle diameter of more than 100 nm were separated using a centrifugal separator with the adjusted centrifugal force of the centrifugal separator so that the dispersion bodies were adjusted to contain 71% of silver nanoparticles having a particle diameter in a range of from 10 nm to 50 nm in terms of number average, thereby obtaining a silver nanoparticle dispersion fluid. The average particle diameter of the obtained silver nanoparticles was 35 nm. Here, the average particle diameter of the silver nanoparticles and the number average content of metal nanoparticles having a particle diameter in a range of 10 nm to 50 nm were measured through a dynamic light scattering method using an LB-550 manufactured by Horiba Ltd. The obtained silver nanoparticles were chemically modified with a protective agent of sodium citrate.

The obtained silver nanoparticles (15 parts by mass) were added to, mixed with, and dispersed in the solution mixture including ethanol and methanol (85 parts by mass), thereby producing an Ag nanoparticle dispersion fluid.

Furthermore, polyvinylpyrrolidone (4 parts by mass) was added as an added substance to the Ag nanoparticle dispersion fluid so that the proportion of the silver nanoparticles became parts by mass, thereby obtaining a silver nanoparticle-sintered film composition 1. In addition, polyvinylpyrrolidone (3 parts by mass) and tin hydroxide (1 part by mass) were added as added substances to the Ag nanoparticle dispersion fluid so that the proportion of the silver nanoparticles became 96 parts by mass, thereby obtaining a silver nanoparticle-sintered film composition 2. Polyvinylpyrrolidone (3 parts by mass) and silver acetate (1 part by mass) were added as added substances to the Ag nanoparticle dispersion fluid so that the proportion of the silver nanoparticles became 96 parts by mass, thereby obtaining a silver nanoparticle-sintered film composition 3.

<<Manufacturing of the Silver Nanoparticle-Sintered Film>>

Film formation was carried out several times on a glass substrate using the produced silver nanoparticle-sintered film composition 1 through spin coating at 1000 rpm for 60 seconds, and then firing was carried out at 200° C. for 30 minutes, thereby forming a silver nanoparticle-sintered film 1 having a film thickness of approximately 300 nm. Similarly, a silver nanoparticle-sintered film 2 was formed using the silver nanoparticle-sintered film composition 2, and a silver nanoparticle-sintered film 3 was formed using the silver nanoparticle-sintered film composition 3. Here, the film thickness was measured through cross-sectional surface observation using a scanning electron microscope manufactured by Hitachi High-Technologies Corporation (SEM, apparatus name: S-4300, SU-8000). The film thickness was measured in the same manner in other examples and comparative examples.

In similar to the silver nanoparticle-sintered film 1, a silver nanoparticle-sintered film 4 containing 1 mass % of Mg and a silver nanoparticle-sintered film 5 containing 1.5 mass % of Sn were formed. At this time, magnesium hydroxide was used as a raw material of Mg, and tin chloride was used as a raw material of Sn.

Example 1

Manufacturing of the Conductive Reflective Film

A total of 4 g of tetraethoxysilane and ethyl alcohol were added using a 500 cm$^3$ four-neck glass flask so that the tetraethoxysilane became 10 mass %, and 12.03 g of a solution containing 0.05 g of 60% nitric acid dissolved in pure water was added at one stroke while stirring the above mixture. After that, a reaction was caused at 50° C. for 3 hours so as to produce a surface coating composition raw material. Furthermore, the surface coating composition raw material was diluted to a predetermined concentration by adding ethanol, thereby producing 400.4 g of a surface coating composition. The surface coating composition was wet-coated on the manufactured silver nanoparticle-sintered film 1 through spin coating, a surface coating coated film was formed, and then the surface coating coated film was fired at 200° C. for 20 minutes in a nitrogen atmosphere, thereby forming a surface coating layer having a thickness of 200 nm and manufacturing a conductive reflective film.

<<Measurement of the Reflectivity>>

The reflectivity of the conductive reflective film was evaluated by measuring the reflectivity (diffusion reflectivity) of the conductive reflective film at a wavelength of 450 nm using a combination of a spectrophotometer for ultraviolet and visible ranges and an integrating sphere. Table 1 shows the results.

<<Measurement of the Surface Resistance>>

The surface resistance (unit: Ω/□) of the conductive reflective film was measured using a specimen with measured reflectivity and a LORESTA manufactured by Mitsubishi Chemical Analytech Co., Ltd. Table 1 shows the results.

<<Measurement of the Adhesion Properties>>

The adhesion properties were evaluated into two levels of ○ and X through a method according to a tape test (JIS K-5600) using a specimen for which the surface resistance measurement was completed by adhering a tape to the conductive reflective film. A case in which the conductive reflective film did not attach to the tape side, and only the adhesion tape was peeled was evaluated as "○", and a case in which the base material was exposed was evaluated as "X". Table 1 shows the results.

Examples 2 to 11

Surface coating compositions were produced, and surface coated layers were formed, thereby manufacturing conductive reflective films in the same manner as in Example 1 except that the compositions shown in Table 1 were used. The obtained conductive reflective films were evaluated in the same manner as in Example 1. Table 1 shows the results.

Comparative Example 1

An obtained conductive reflective film was evaluated in the same manner as in Example 1 with no changes made to the manufactured conductive reflective film. Table 1 shows the results.

Comparative Example 2

The silver nanoparticle-sintered film composition (5 g) and the surface coating composition of Example 1 (0.1 g) were mixed. Film formation was carried out several times on a glass substrate through spin coating at 1000 rpm for 60 seconds using the mixture, and then firing was carried out at 200° C. for 30 minutes, thereby forming a conductive reflective film having a thickness of approximately 300 nm. The obtained conductive reflective film was evaluated in the same manner as in Example 1. Table 1 shows the results.

TABLE 1

| | Surface coating composition | | Conductive reflective film | | | | |
|---|---|---|---|---|---|---|---|
| | Metal alkoxide | Solvent | Silver nanoparticle-sintered film | Thickness of surface-coated layer (mm) | Reflectivity (%) | Surface resistance (Ω/□) | Adhesion properties |
| Ex. 1 | Tetraethoxysilane: 0.1 parts by mass | Ethyl alcohol: 96.99 parts by mass + water: 3 parts by mass + nitric acid: 0.01 parts by mass | 1 | 0.01 | 89 | 0.21 | ○ |
| Ex. 2 | Tetraethoxysilane: 0.2 parts by mass | Ethyl alcohol: 96.89 parts by mass + water: 3 parts by mass + nitric acid: 0.01 parts by mass | 1 | 0.02 | 89 | 0.23 | ○ |
| Ex. 3 | Tetraethoxysilane: 0.4 parts by mass | Ethyl alcohol: 96.69 parts by mass + water: 3 parts by mass + nitric acid: 0.01 parts by mass | 1 | 0.05 | 88 | 0.23 | ○ |
| Ex. 4 | Tetraethoxysilane: 0.8 parts by mass | Ethyl alcohol: 96.29 parts by mass + water: 3 parts by mass + nitric acid: 0.01 parts by mass | 1 | 0.08 | 88 | 0.25 | ○ |
| Ex. 5 | Tetraethoxysilane: 5.0 parts by mass | Ethyl alcohol: 91.99 parts by mass + water: 3 parts by mass + nitric acid: 0.01 parts by mass | 1 | 0.50 | 82 | 0.34 | ○ |

TABLE 1-continued

| | Surface coating composition | | Conductive reflective film | | | | |
|---|---|---|---|---|---|---|---|
| | Metal alkoxide | Solvent | Silver nanoparticle-sintered film | Thickness of surface-coated layer (mm) | Reflectivity (%) | Surface resistance (Ω/□) | Adhesion properties |
| Ex. 6 | Tetramethoxysilane: 0.5 parts by mass | Ethyl alcohol: 96.49 parts by mass + water: 3 parts by mass + nitric acid: 0.01 parts by mass | 1 | 0.05 | 85 | 0.22 | ○ |
| Ex. 7 | Titanium tetraisopropoxide: 0.5 parts by mass | Ethyl alcohol: 96.49 parts by mass + water: 3 parts by mass + nitric acid: 0.01 parts by mass | 1 | 0.05 | 88 | 0.24 | ○ |
| Ex. 8 | Tetraethoxysilane: 0.1 parts by mass | Ethyl alcohol: 96.99 parts by mass + water: 3 parts by mass + nitric acid: 0.01 parts by mass | 2 | 0.02 | 93 | 0.24 | ○ |
| Ex. 9 | Tetraethoxysilane: 0.2 parts by mass | Ethyl alcohol: 96.89 parts by mass + water: 3 parts by mass + nitric acid: 0.01 parts by mass | 3 | 0.02 | 93 | 0.19 | ○ |
| Ex. 10 | Tetraethoxysilane: 0.4 parts by mass | Ethyl alcohol: 96.69 parts by mass + water: 3 parts by mass + nitric acid: 0.01 parts by mass | 4 | 0.02 | 92 | 0.21 | ○ |
| Ex. 11 | Titanium tetraisopropoxide: 0.5 parts by mass | Ethyl alcohol: 96.49 parts by mass + water: 3 parts by mass + nitric acid: 0.01 parts by mass | 5 | 0.02 | 92 | 0.21 | ○ |
| Comp. Ex. 1 | — | — | 1 | — | 94 | 0.21 | X |
| Comp. Ex. 2 | — | — | — | — | 60 | 1.21 | X |

As is evident from Table 1, the reflectivity was high, the surface resistance was low, and the adhesion properties were also favorable in Examples 1 to 11. In contrast to the above, in Comparative example 1 in which the film was not coated with the surface coating composition, the reflectivity was poor, and, in Comparative example 2 in which the silver nanoparticle-sintered film composition and the surface coating composition were mixed, and then a conductive reflective film was formed, the surface resistance was high, and the reflectivity was low.

The conductive reflective film of the invention can provide a conductive reflective film with improved adhesion properties with respect to the base material which maintains the high reflectivity and high conductivity of the silver nanoparticle-sintered film by coating the silver nanoparticle-sintered film with the surface coating composition. The conductive reflective film is particularly suitable for a thin film solar cell.

DESCRIPTION OF REFERENCE NUMERALS AND SIGNS

1 THIN FILM SOLAR CELL
10 SUBSTRATE
11 TRANSPARENT ELECTRODE LAYER
12 PHOTOELECTRIC CONVERSION LAYER
13 TRANSPARENT CONDUCTIVE FILM
14 CONDUCTIVE REFLECTIVE FILM

What is claimed:

1. A conductive reflective film provided on a transparent conductive film, said conductive reflective film comprising:
    a silver nanoparticle-sintered film; and
    a surface coating composition containing a hydrolysate of a metal alkoxide that has been wet coated on the silver nanoparticle-sintered film, wherein
    the coated silver nanoparticle-sintered film has been fired.

2. A thin film solar cell rear surface electrode comprising:
    the conductive reflective film provided on a transparent conductive film according to claim 1.

3. A thin film solar cell comprising:
    the thin film solar cell rear surface electrode according to claim 2.

4. The conductive reflective film provided on a transparent conductive film according to claim 1, wherein the conductive reflective film has a surface resistance of 0.34Ω/□ or lower.

5. The conductive reflective film provided on a transparent conductive film according to claim 1, wherein
    the transparent conductive film is a base material on which the conductive reflective film is formed, and
    the conductive reflective film has adhesiveness sufficient to attach an adhesion tape in a such manner that the adhesion tape can be peeled without exposing the base material of the conductive reflective film.

6. The conductive reflective film provided on a transparent conductive film according to claim 1, wherein the hydrolysate of the metal alkoxide contains a metal selected from the group consisting of: silicon, titanium, aluminum, chromium, manganese, iron, cobalt, nickel, silver, copper, zinc, molybdenum, tin, indium and antimony.

7. The conductive reflective film provided on a transparent conductive film according to claim 1, wherein the metal alkoxide contains an alkoxide selected from the group consisting of: methoxide, ethoxide and butoxide.

8. The conductive reflective film provided on a transparent conductive film according to claim 1, wherein the metal alkoxide is tetramethoxysilane.

* * * * *